(12) United States Patent
Northam

(10) Patent No.: US 6,239,664 B1
(45) Date of Patent: May 29, 2001

(54) LOW PHASE NOISE, WIDE TUNING RANGE OSCILLATOR UTILIZING A ONE PORT SAW RESONATOR AND METHOD OF OPERATION

(75) Inventor: Alan R. Northam, Fairview, TX (US)

(73) Assignee: RF Monolithics, Inc., Dallas, TX (US)

( * ) Notice: Subject to any disclaimer, the term of this patent is extended or adjusted under 35 U.S.C. 154(b) by 0 days.

(21) Appl. No.: 09/263,136

(22) Filed: Mar. 5, 1999

(51) Int. Cl.[7] .................................................... H03B 5/12
(52) U.S. Cl. ................... 331/108 R; 331/116 M; 331/132; 331/177 V
(58) Field of Search ........................... 331/107 A, 116 R, 331/117 R, 177 V, 107 R, 108 R, 107 DD, 116 M, 132, 154, 167

(56) References Cited

U.S. PATENT DOCUMENTS

| | | | |
|---|---|---|---|
| 4,135,085 | * | 1/1979 | Driscoll et al. .................. 331/116 R |
| 4,493,021 | * | 1/1985 | Agrawal et al. ...................... 364/200 |
| 4,630,002 | * | 12/1986 | Leiba ...................................... 331/96 |
| 5,036,295 | * | 7/1991 | Kamitani .................................. 331/10 |
| 5,043,681 | * | 8/1991 | Tanemura et al. ................ 331/107 A |
| 6,046,650 | * | 4/2000 | Lichterfield ........................... 332/123 |

* cited by examiner

*Primary Examiner*—Robert Pascal
*Assistant Examiner*—Kimberly Glenn

(57) ABSTRACT

There is disclosed a SAW resonator-based oscillator circuit having low phase noise that is tunable across a comparatively wide frequency range. The oscillator circuit comprises: 1) a tuning element coupled to the input port and having a variable capacitance responsive to the frequency tuning signal; 2) a first inductor coupled in series with the tuning element; 3) a SAW resonator coupled in series with first inductor; 4) a second inductor coupled in parallel with the SAW resonator; 5) a negative resistance generating circuit coupled to the SAW resonator. Across the tunable operating frequency range of the oscillator circuit, the reactance looking into the input port is maintained at approximately zero and the resistance looking into the input port remains negative.

20 Claims, 17 Drawing Sheets

LOW PHASE NOISE, WIDE TUNING RANGE OSCILLATOR UTILIZING A ONE PORT SAW RESONATOR AND METHOD OF OPERATION

TECHNICAL FIELD OF THE INVENT

The present invention is directed, in general, to electronic systems that incorporate surface acoustic wave (SAW) devices and, more specifically, to electronic systems that include SAW-based low phase noise oscillators that are tunable over comparatively wide ranges.

BACKGROUND OF THE INVENTION

Many electronic systems contain oscillator circuits that generate high-frequency reference signals that are used both internally and externally by the electronic system. For example, the reference signal may be used as a high-speed CPU clock in a data processing device or as a high-frequency local oscillator (LO) carrier signal in a communication device, such as a base station transceiver in a wireless network. The high-frequency reference signal may also be used as a calibration reference in testing and measurement systems.

Generally, it is highly desirable for an oscillator circuit to exhibit low phase noise characteristics. This is usually accomplished by using resonators or tuned circuits that have a high Q-factor. Because quartz crystals and SAW devices exhibit much higher Q-factors than ordinary LC circuits, oscillator circuits that use quartz crystals and SAW devices as frequency determining elements inherently exhibit much lower phase noise than conventional LC oscillator circuits.

Additionally, many electronic systems require that an oscillator circuit be electronically tunable over some required frequency range. It is preferred that the tuning range be comparatively wide and highly linear in the tuning range. Frequently, a varactor diode or other capacitive element is used in conjunction with LC oscillator circuits to provide a tuning capability. The varactor diode interacts with the inductance of the LC oscillator circuit to generate a variable output frequency.

Unfortunately, however, coupling a varactor diode or other capacitive element to a high Q-factor frequency controlling element, such as a SAW device, does not result in a tunable, low phase noise oscillator circuit. As a practical matter, the same electrical characteristics that cause a high Q-factor frequency controlling element to produce good phase noise performance also limit the tuning range of that circuit.

To overcome this limitation, oscillator circuits have been implemented that couple together two or more SAW devices in order to achieve a wider tuning range and low phase noise. However, the use of multiple SAW elements increases the complexity and the cost of these oscillator circuits.

There is therefore a need in the art for improved oscillator circuits that exhibit low phase noise and linear tuning characteristics. In particular, there is a need in the art for a tunable oscillator circuit that uses only a single one-port SAW resonator as a frequency determining element. More particularly, there is a need for a voltage controlled SAW oscillator (VCSO) that exhibits low phase noise and linear tuning across a comparatively wide tuning range (on the order of +/−400 PPM).

SUMMARY OF THE INVENTION

To address the above-discussed deficiencies of the prior art, it is a primary object of the present invention to provide a low phase noise oscillator circuit having an input port and an output port that receives a frequency tuning signal on the input port and generates a tunable high-frequency output signal on the output port. Accordingly, in an advantageous embodiment of the present invention, the oscillator circuit comprises:

1) a tuning element coupled to the input port and having a variable capacitance responsive to the frequency tuning signal;

2) a first inductor coupled in series with the tuning element;

3) a SAW resonator coupled in series with first inductor;

4) a second inductor coupled in parallel with the SAW resonator;

5) a negative resistance generating circuit coupled to the SAW resonator, wherein, at a first oscillation frequency of the oscillator circuit, a reactance looking into the input port is approximately zero and a resistance looking into the input port is negative.

According to one embodiment of the present invention, the tuning element comprises at least one varactor diode.

According to another embodiment of the present invention, a frequency domain curve of the reactance has a steep slope at the operating frequency.

According to still another embodiment of the present invention, modifying the variable capacitance causes the reactance looking into the input port to equal approximately zero at a second oscillation frequency.

According to yet another embodiment of the present invention, the slope of the reactance is approximately linear at the operating frequency.

According to a further embodiment of the present invention, an operating frequency of the oscillator circuit may be varied across an operating range having an upper frequency limit and a lower frequency limit, wherein the frequency domain curve of the reactance has a steep slope across the operating range.

According to a still further embodiment of the present invention, the frequency domain curve of the reactance across the operating range is approximately linear.

According to a still further embodiment of the present invention, the SAW resonator has a resonance frequency and the first inductor causes the first oscillation frequency of the oscillator circuit to match the resonance frequency.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION

FIGS. 1 through 17, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged electronic apparatus requiring a high-frequency signal source having low phase noise and linear tuning over a comparatively wide tuning range.

In particular, the exemplary embodiments described below set forth particular values for components, such as resistors, capacitors, inductors, and the like, and for operating parameters, such as nominal operating frequency, phase-noise limits, tunability ranges, and the like. Those skilled in the art will readily understand that these exemplary values are selected for the purposes of explanation only and may easily be modified in order to implement the present invention in a wide range of electronic devices.

Figure 1:
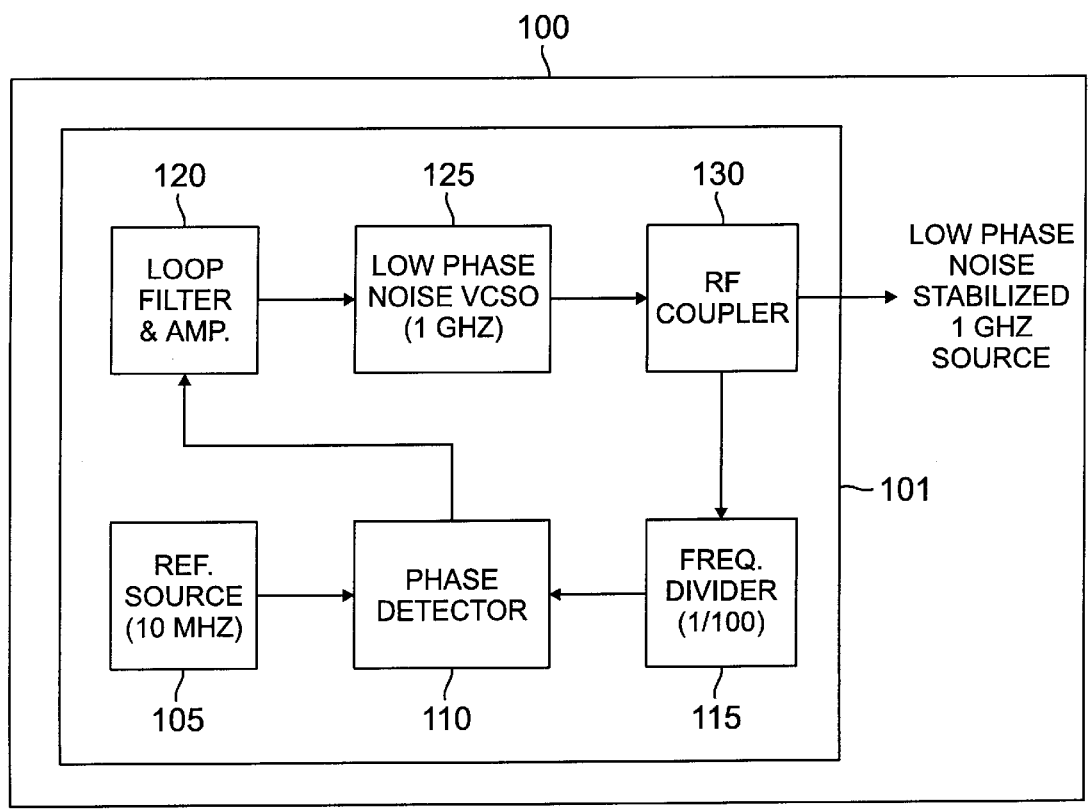
FIG. 1 is a block diagram of an exemplary electronic system comprising a tunable high-frequency signal generator, which incorporates a low phase noise voltage controlled surface acoustic wave (SAW) oscillator (VCSO) in accordance with one embodiment of the present invention.

FIG. 1 is a block diagram of exemplary electronic system 100 comprising tunable high-frequency signal generator 101, which incorporates low phase noise voltage controlled surface acoustic wave (SAW) oscillator (VCSO) 125 in accordance with one embodiment of the present invention. Exemplary electronic system 100 may comprise, for example, a transceiver in a base station of a wireless network, a data processing device that requires a stable high-frequency clock signal, a testing or measuring device that requires a stable, high-frequency reference signal having low phase noise, a television tuner, a radio tuner, or the like.

Tunable signal generator 101 contains an exemplary phase-locked loop comprising 10 MHz reference source 105, phase detector 110, frequency divider 115, loop filter and amplifier 120, low phase noise VCSO 125, and RF coupler 130. The output of signal generator 101 is a 1 GHz signal that is tunable, stabilized, and has low phase noise. In the described embodiment, the 10 MHz output of 10 MHz reference source 105 and the 1 GHz output of low phase noise VCSO 125 are nominal values selected for the purposes of illustration only. In fact, low phase noise VCSO 125 may be designed to operate at virtually any operating frequency.

A copy of the 1 GHz output signal is split off by RF coupler 130 and is supplied to frequency divider 115. Frequency divider 115 divides the 1 GHz output signal by a factor of 100, thereby producing a 10 MHz reference that is applied to one input of phase detector 110. The other input of phase detector 110 is a 10 MHz reference signal received from 10 MHz reference source 105. Phase detector 110 compares the two inputs to detect phase difference and generates an output error signal that is applied to loop filter and amplifier 120. Loop filter and amplifier 120 filters spurious noise signals from the output error signal and amplifies it to an appropriate level.

The amplified and filtered error signal is the control voltage that controls (tunes) the operating frequency of low phase noise VCSO 125. If the actual operating frequency of the 1 GHz output signal is too high, the control voltage applied to low phase noise VCSO 125 by phase detector 110 changes in such a way (up or down) as to reduce the operating frequency of low phase noise VCSO 125. If the actual operating frequency of the 1 GHz output signal is too low, the control voltage applied to low phase noise VCSO 125 by phase detector 110 changes in such a way (up or down) as to increase the operating frequency of low phase noise VCSO 125. In this manner, the operating frequency of low phase noise VCSO 125 is maintained near the selected nominal level of 1 GHz.

The operating frequency of low phase noise VCSO 125 may be tuned to different levels by modifying the operating frequency of 10 MHz reference source 105. As the nominal 10 MHz output of 10 MHz reference source 105 is increased or decreased, the error signal produced by phase detector 110 increases or decreases the operating frequency of low phase noise VCSO 125 correspondingly. In an advantageous embodiment of the present invention, low phase noise VCSO 125 can be tuned by +/−400 PPM (parts per million) around the nominal operating frequency. For example, if the operating frequency of low phase noise VCSO 125 is 1 GHz, then the output of low phase noise VCSO 125 may be increased by 400 KHZ and decreased by 400 KHz around the nominal frequency (i.e., from 999.6 MHz to 1000.4 MHz).

Figure 2:
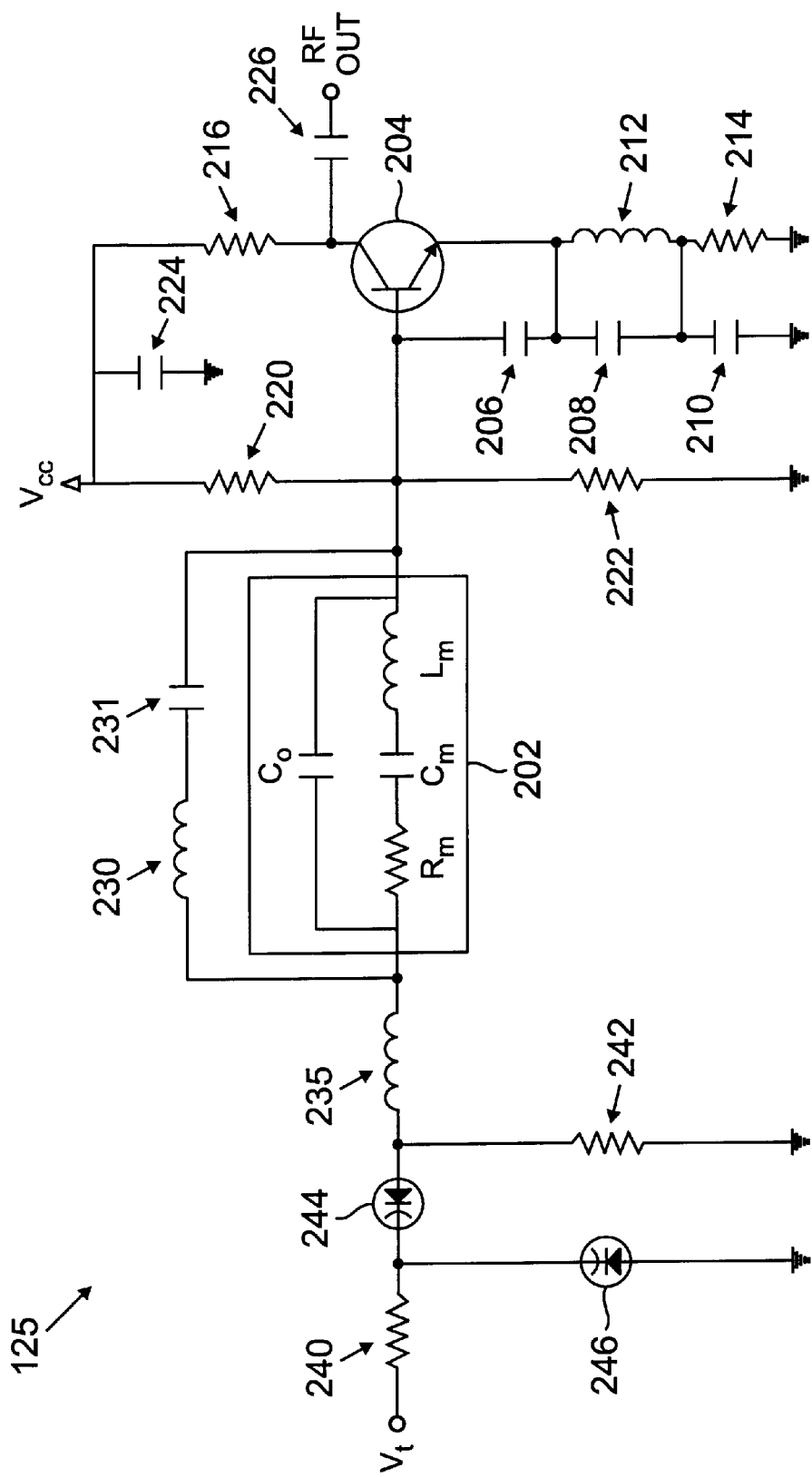
FIG. 2 is a schematic diagram of a low phase noise VCSO in accordance with one embodiment of the present invention.

FIG. 2 is a schematic diagram illustrating low phase noise VCSO 125 in greater detail in accordance with one embodiment of the present invention. The tuning voltage, Vt, represents the control (or error) voltage received from phase detector 110 via loop filter and amplifier 120. The signal RF OUT represents the nominal 1 GHZ output of low phase noise VCSO 125.

Low phase noise VCSO 125 comprises SAW resonator 202, in which the elements $R_m$, $C_m$, and $L_m$ are the equivalent series circuit of a typical single-port 1 GHz SAW resonator. $C_o$ represents the internal and package capacitance of SAW resonator 202. Oscillation in SAW resonator 202 is caused by transistor 204 and capacitors 206 and 208, which form a negative resistance (impedance) generator circuit. Resistors 214, 220 and 222 are used to establish the bias point of transistor 204. Those skilled in the art will recognize that the negative resistance generator circuit shown in FIG. 2 is by way of example only. Other negative resistance generator circuits may readily be used to achieve the same effect as the illustrated embodiment. In alternate embodiments of the present invention, a multiple transistor configuration may be used in lieu of a single transistor.

Capacitor 231 provides AC isolation between varactor diodes 244 and 246 and the negative resistance generator circuit. Inductor 235 on the input centers the frequency range of the entire low phase noise VCSO 125. The RF OUT signal appears across load resistor 216 in the collector of transistor 204. The output energy of transistor 204 is extracted by capacitor 226, which is a radio frequency coupling capacitor bypass.

On the input, resistor 240 provides isolation and resistor 242 provides a ground reference for varactor diode 244. Varactor diode 244 and varactor diode 246 essentially form a tunable capacitor circuit. As the value of Vt changes, the reverse bias voltage across each of varactor diodes 244 and 246 also changes. Changing the reverse bias voltages changes the effective capacitance of each of varactor diodes 244 and 246. Those skilled in the art will recognize that the varactor diode structure shown in FIG. 2 is by way of example only. Other arrangements of varactor diodes may be used to achieve the same effect as the exemplary arrangement of varactor diodes 244 and 246. In alternate embodiments of the present invention, a single varactor diode structure may be used on the input side of low phase noise VCSO 125. In still other embodiments, more than two varactor diodes may be used to form a tunable capacitance.

In order for the circuit in low phase noise VCSO 125 to oscillate, two conditions must be met at the input point at which the signal $V_t$ is applied. First, the reactance value seen at the input must be zero ohms. Second, the resistance must be negative. Low phase noise VCSO 125 only oscillates at the frequency or frequencies at which these two conditions are simultaneously satisfied. In the exemplary embodiment, it is desired that these two conditions be met at the nominal operating frequency of 1 GHz.

Figure 3:
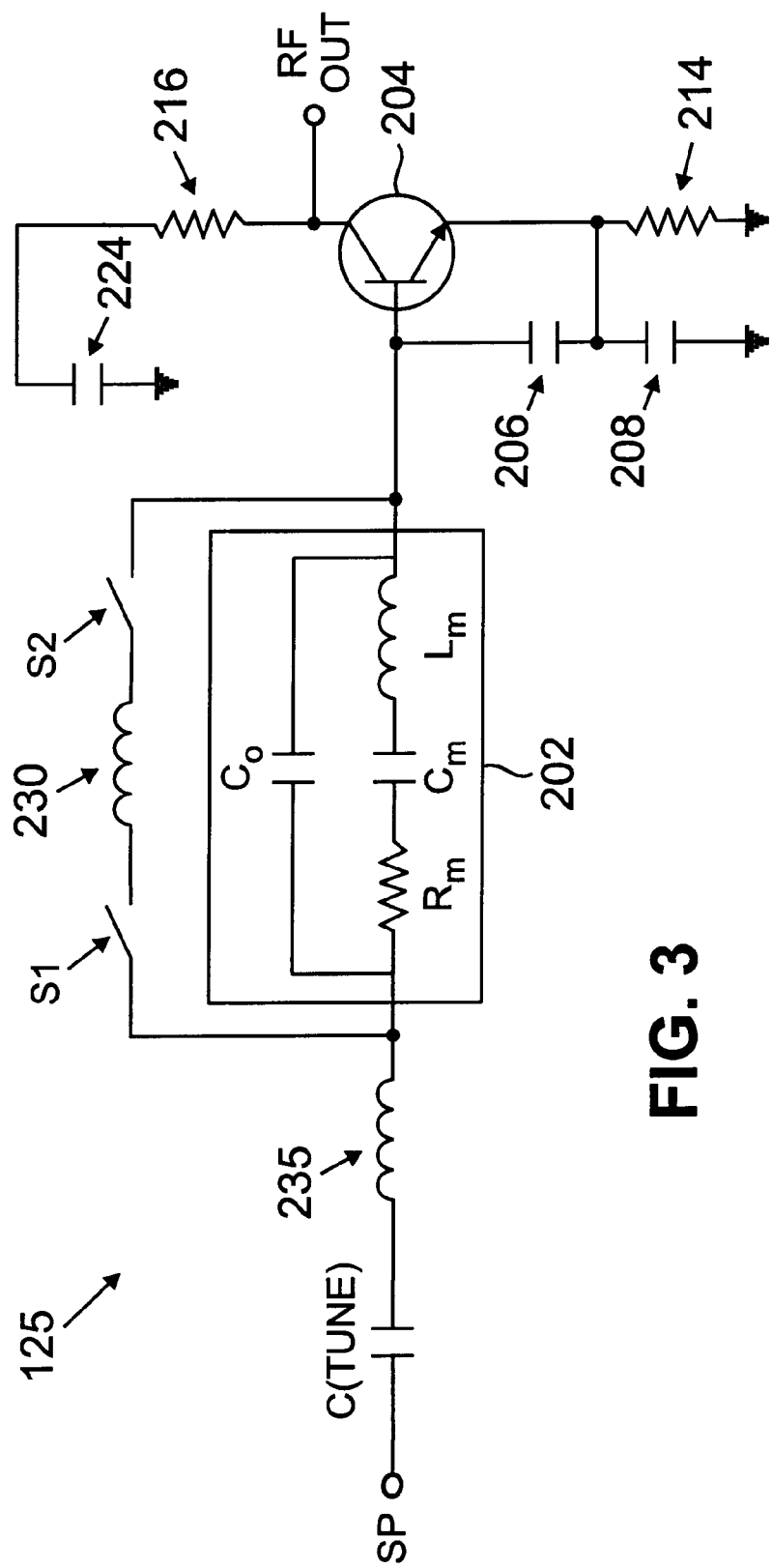
FIG. 3 is a schematic diagram of selected portions of a low phase noise VCSO in accordance with one embodiment of the present invention.

In order to better understand the operation of low phase noise VCSO 125, the operation of selected portions of the schematic diagram in FIG. 2 are separately explained below in greater detail. FIG. 3 is a schematic diagram of an AC-equivalent circuit of selected portions of low phase noise VCSO 125 in accordance with one embodiment of the present invention. Switches S1 and S2 are inserted for the purposes of explaining the operation of low phase noise VCSO 125 with and without inductor 230.

In the illustrated embodiment in FIG. 3, varactor diodes 244 and 246 and resistors 240 and 242 have been replaced by an equivalent tuning capacitor, labeled C(tune). Additionally, biasing resistors 220 and 222, capacitor 231, and RF coupling capacitor 226 are omitted from the AC-equivalent circuit.

In an exemplary embodiment (with inductor 230 disconnected), the components have the following nominal values:

1. C(tune)=1.3167 pF
2. Inductor 235=61.2913 nH
3. SAW resonator 202:
   $R_m$=15 ohm
   $C_m$=0.0014511 pF
   $L_m$=17469.2 nH
   $C_o$=2 pF
4. Capacitor 206=1.84599 pF
5. Capacitor 208=0.746215 pF
6. Capacitor 224=100 pF
7. Resistor 214=1000 ohm
8. Resistor 216=100 ohm SAW resonator 202 is resonant at 1 GHz. As noted above, oscillation occurs at the frequency of interest, 1 GHz, only if the reactance value seen at the sense point is zero ohms and the resistance is negative.

Figure 4:
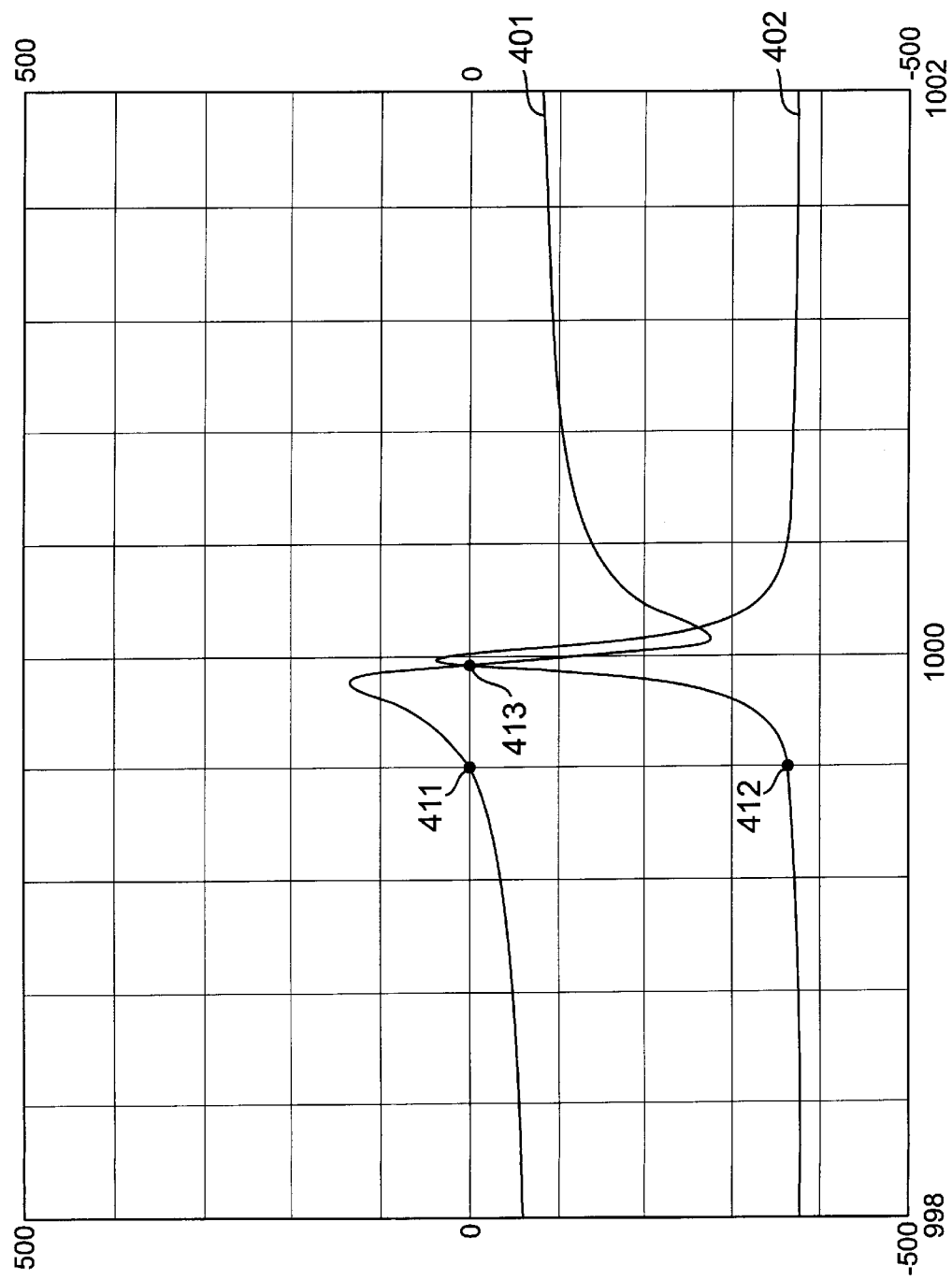
FIG. 4 is a frequency domain plot of the resistance curve and the reactance curve seen at the input in the circuit illustrated in FIG. 3.

FIG. 4 is a frequency domain plot of the resistance curve 402 and the reactance curve 401 seen at the sense point in the circuit illustrated in FIG. 3. It can be determined from these curves that oscillation can only occur at approximately 999.6 MHz, where the reactance is zero ohms (point 411) and resistance is −370 ohms (point 412). However, this is well below the 1 GHz SAW resonance frequency. At point 413, reactance is also zero ohms, but resistance is positive.

In fact, at all other frequencies on this plot, either resistance is positive or reactance is not zero, or both. Thus, oscillation cannot occur at or above the 1 GHz SAW resonance frequency.

Figure 5:
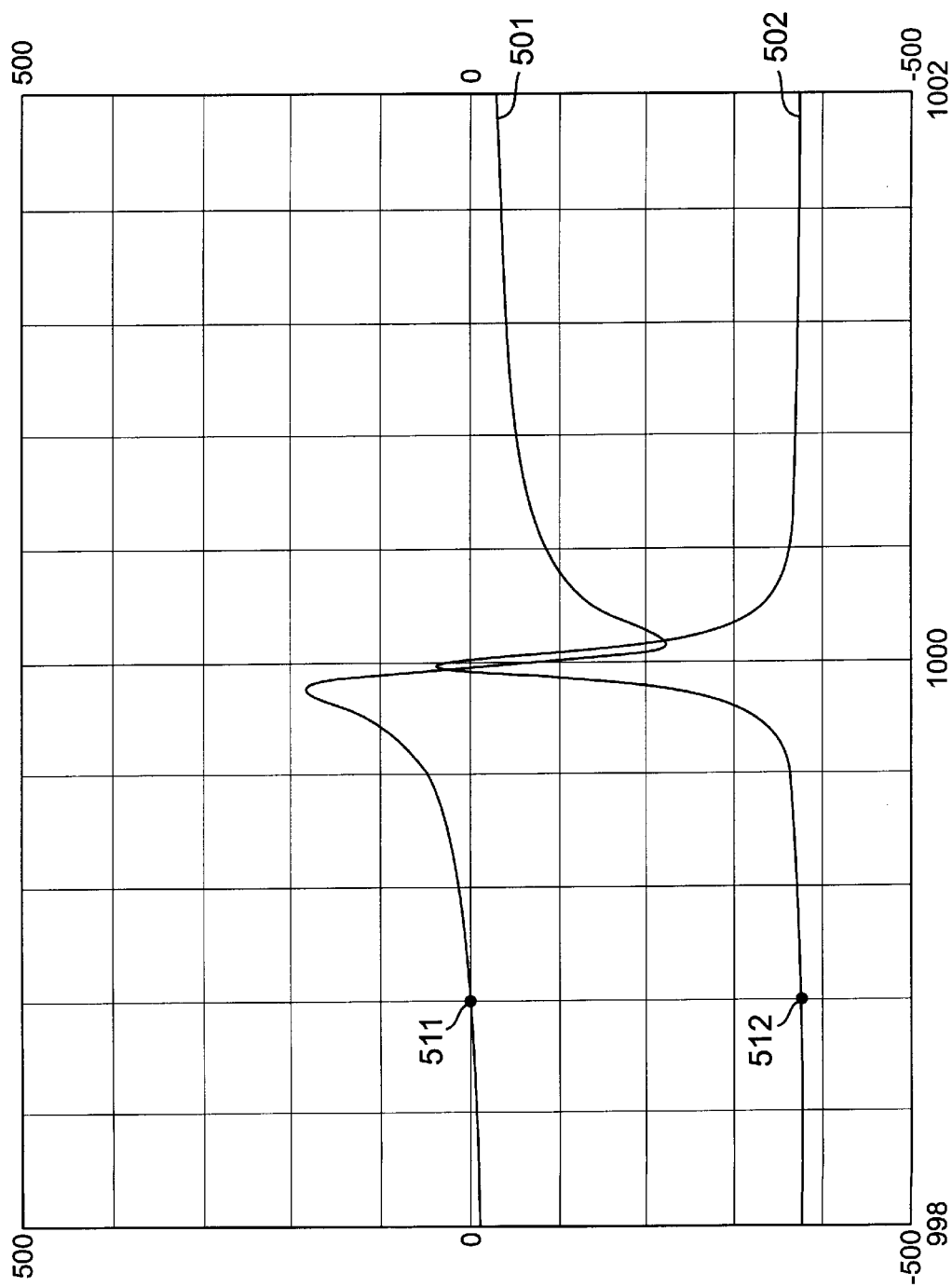
FIG. 5 is a frequency domain plot of the resistance curve and the reactance curve seen at the sense point in the circuit illustrated in FIG. 3, demonstrating the effect of adjusting the tuning capacitor.

FIG. 5 is a frequency domain plot of resistance curve 502 and reactance curve 501 seen at the sense point in the circuit illustrated in FIG. 3 demonstrating the effect of adjusting the tuning capacitor, C(tune). If C(tune) is electrically tuned to a nominal value of 2.15765 pF, resistance curve 502 is essentially the same as resistance curve 402, but reactance curve 501 is shifted upward with respect to reactance curve 401.

It can be determined from curves 501 and 502 that oscillation occurs at approximately 998.8 MHz, where the reactance is zero ohms (point 511) and resistance is about −375 ohms (point 512). This represents a frequency change of 0.8 MHz, which corresponds to the desired tuning frequency range of +/−400 PPM. Again, however, this is well below the 1 GHz SAW resonance frequency.

Although the frequency of oscillation can be changed over a fairly wide range by means of C(tune), the parameters of the circuit are changing drastically. This creates serious problems in terms of phase noise and tuning linearity. For low phase noise, it is necessary to keep the reactance slope as steep as possible. For tuning linearity, it is necessary to keep this curve as straight as possible over the desired operating frequency range. If the reactance curve is too shallow, low phase noise VCSO 125 becomes susceptible to noise and stability perturbations that are inherent in any electronic apparatus in which low phase noise VCSO 125 may be implemented. Furthermore, the straighter the reactance curve is, the greater is the tuning linearity in the desired operating frequency range.

The performance of low phase noise VCSO 125 is improved by the addition of inductor 230 in parallel with SAW resonator 202 (i.e., with switches S1 and S2 closed). Inductor 230, which has a value of 12.75 nH, is calculated to resonate with the 2 pF value of $C_o$, the internal and package capacitance of SAW resonator 202. Additionally, the value of inductor 235 is changed to 37.4042 nH in order to shift the circuit oscillation center frequency to that of SAW resonator 202 (i.e., 1 GHz).

Figure 6:
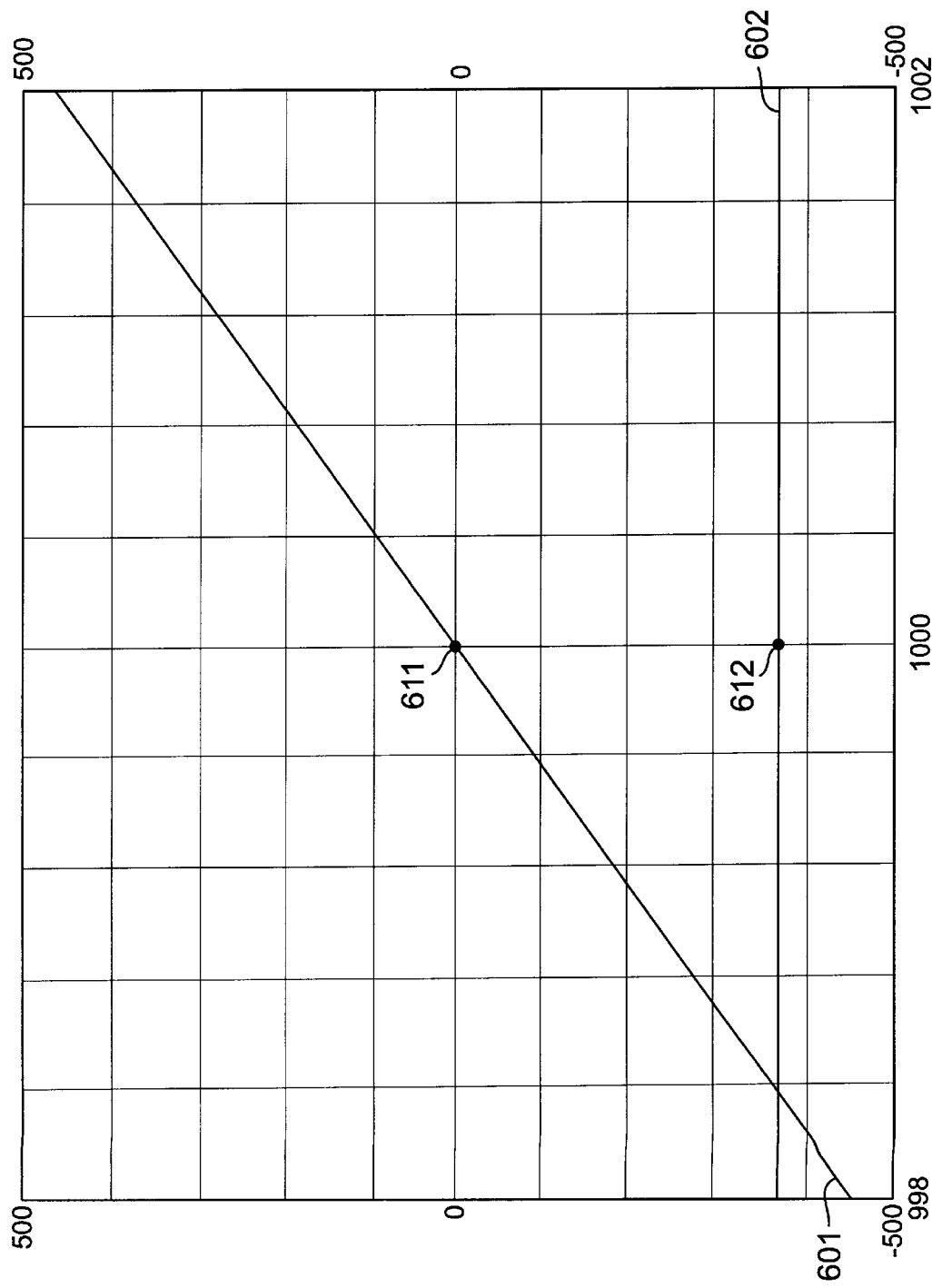
FIG. 6 is a frequency domain plot of the resistance curve and the reactance curve seen at the sense point in the circuit illustrated in FIG. 3, when an inductor is placed in parallel to the SAW resonator and the value of the tuning inductor is adjusted.

FIG. 6 is a frequency domain plot of resistance curve 602 and reactance curve 601 seen at the sense point, SP, in the circuit illustrated in FIG. 3, when inductor 230 is placed in parallel to SAW resonator 202 and the value of tuning inductor 235 is adjusted. The positive going resistance peak has been eliminated from the narrow frequency range from 998–1002 MHz. Additionally, the reactance curve is both linear and steep over the same range. Furthermore, at the nominal operating frequency of 1 GHz, the reactance is zero ohms (point 611) and the resistance is about −360 ohms (point 612).

Figure 7:
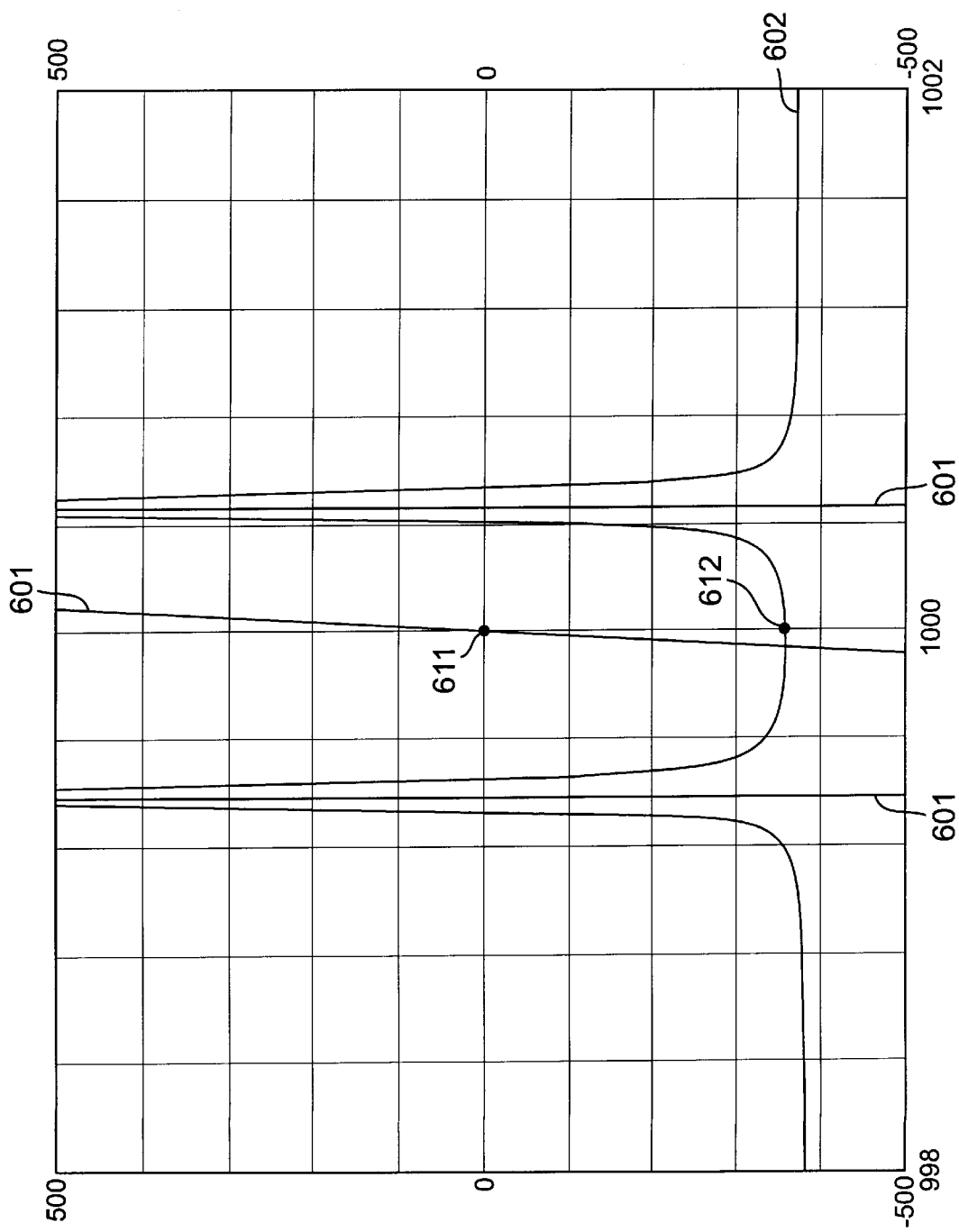
FIG. 7 is a wider frequency domain plot of the resistance curve and the reactance curve illustrated in FIG. 6.

FIG. 7 is a wider frequency domain plot, from 950–1050 MHz, of resistance curve 602 and reactance curve 601 illustrated in FIG. 6. Point 612 on resistance curve 602 and point 611 on reactance curve 601 are shown for reference purposes. Resistance curve 602 now contains two positive resistance spikes, each more than 10 MHz away from the 1 GHz operating frequency. These resistance spikes do not pose a problem to the operation of low phase noise VCSO 125 because the corresponding reactance value is non-zero.

Figure 8:
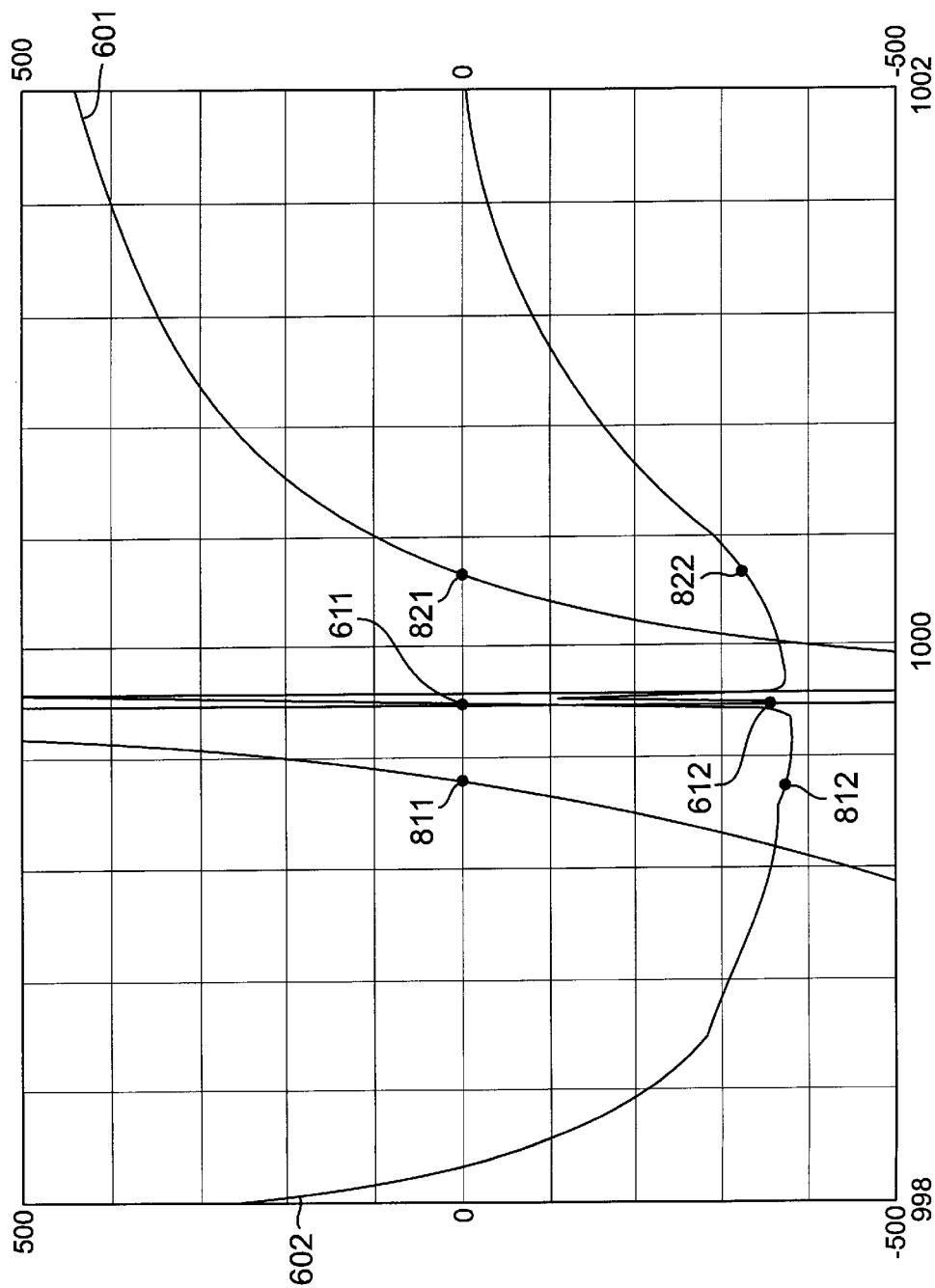
FIG. 8 is very wide frequency domain plot of the resistance curve and the reactance curve illustrated in FIGS. 6 and 7.

FIG. 8 is a very wide frequency domain plot of resistance curve 602 and reactance curve 601 illustrated in FIGS. 6 and 7. Point 612 on resistance curve 602 and point 611 on reactance curve 601 are shown for reference purposes. FIG. 8 illustrates two potential problems that may affect the operation of low phase noise VCSO 125. The basic conditions needed for oscillation, namely a reactance value of zero ohms and a negative resistance at the sense point, can now be seen to occur at three frequencies instead of one frequency. Oscillation still occurs at the nominal operating frequency of 1 GHz (points 611 and 612). However, at a frequency of about 860 MHz, the reactance is zero ohms (point 811) and the resistance is about −380 ohms (point 812). Also, at a frequency of about 1240 MHz, the reactance is zero ohms (point 821) and the resistance is about −320 ohms (point 822). In order to guarantee that low phase noise VCSO 125 oscillates only at the desired nominal operating frequency, a preferred embodiment of the present invention incorporates additional circuitry to eliminate oscillation at the undesired frequencies.

Figure 9:
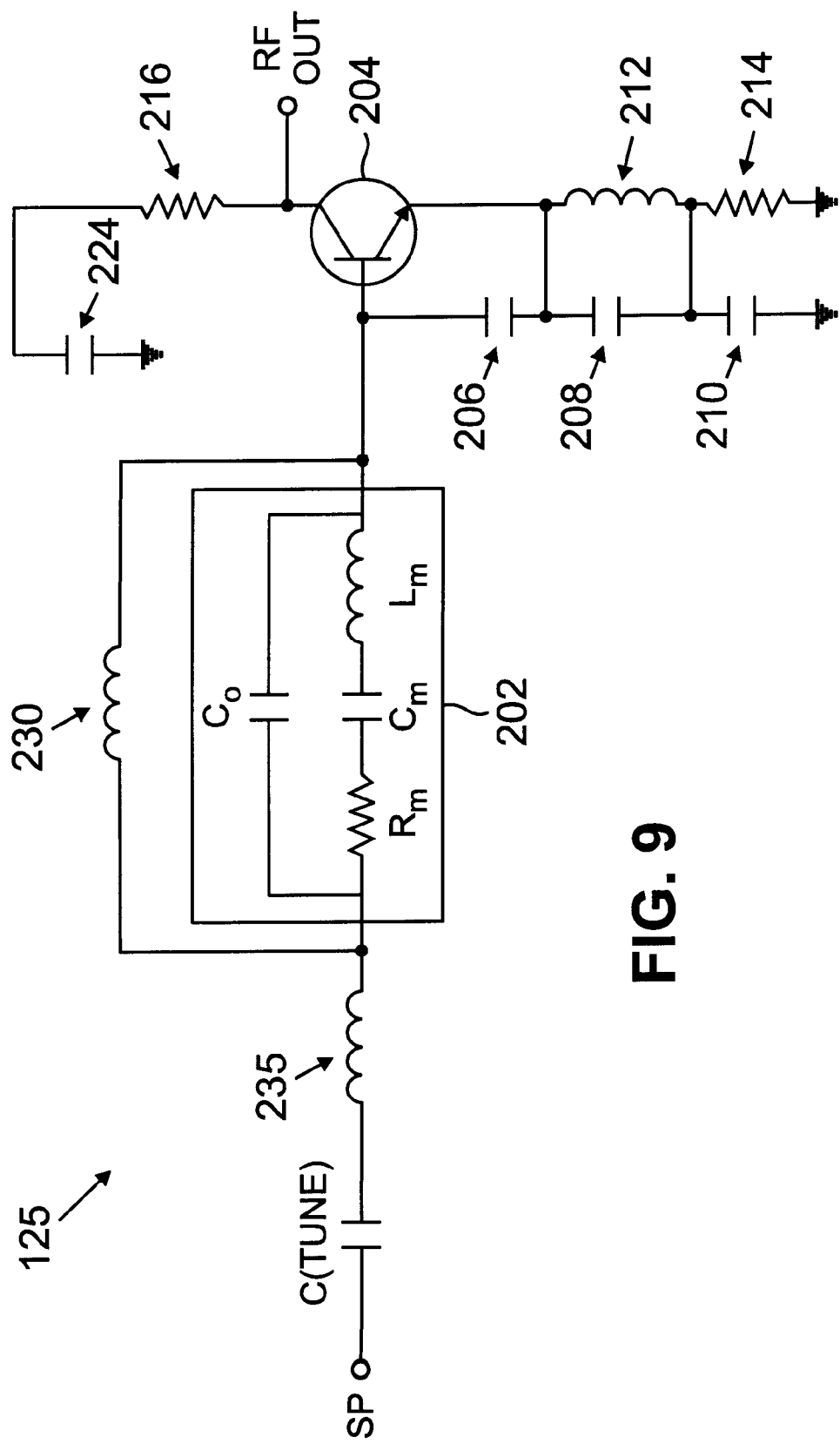
FIG. 9 is a schematic diagram of an AC-equivalent circuit of selected portions of the low phase noise VCSO, including components that eliminate undesired oscillations, in accordance with one embodiment of the present invention.

FIG. 9 is a schematic diagram of an AC-equivalent circuit of selected portions of low phase noise VCSO 125, including components that eliminate undesired oscillations, in accordance with one embodiment of the present invention. Inductor 212 is now included in the emitter of transistor 204. In the exemplary embodiment, the value of inductor 212 is selected to resonate with capacitor 208 at the desired 1 GHz operating frequency. The effect of this is to peak the circuit gain at the desired 1 GHz operating frequency and to lower the circuit gain at all other frequencies, including the undesired 860 MHz and 1240 MHz oscillation frequencies. Capacitor 210 has also been added as an RF bypass.

Figure 10:
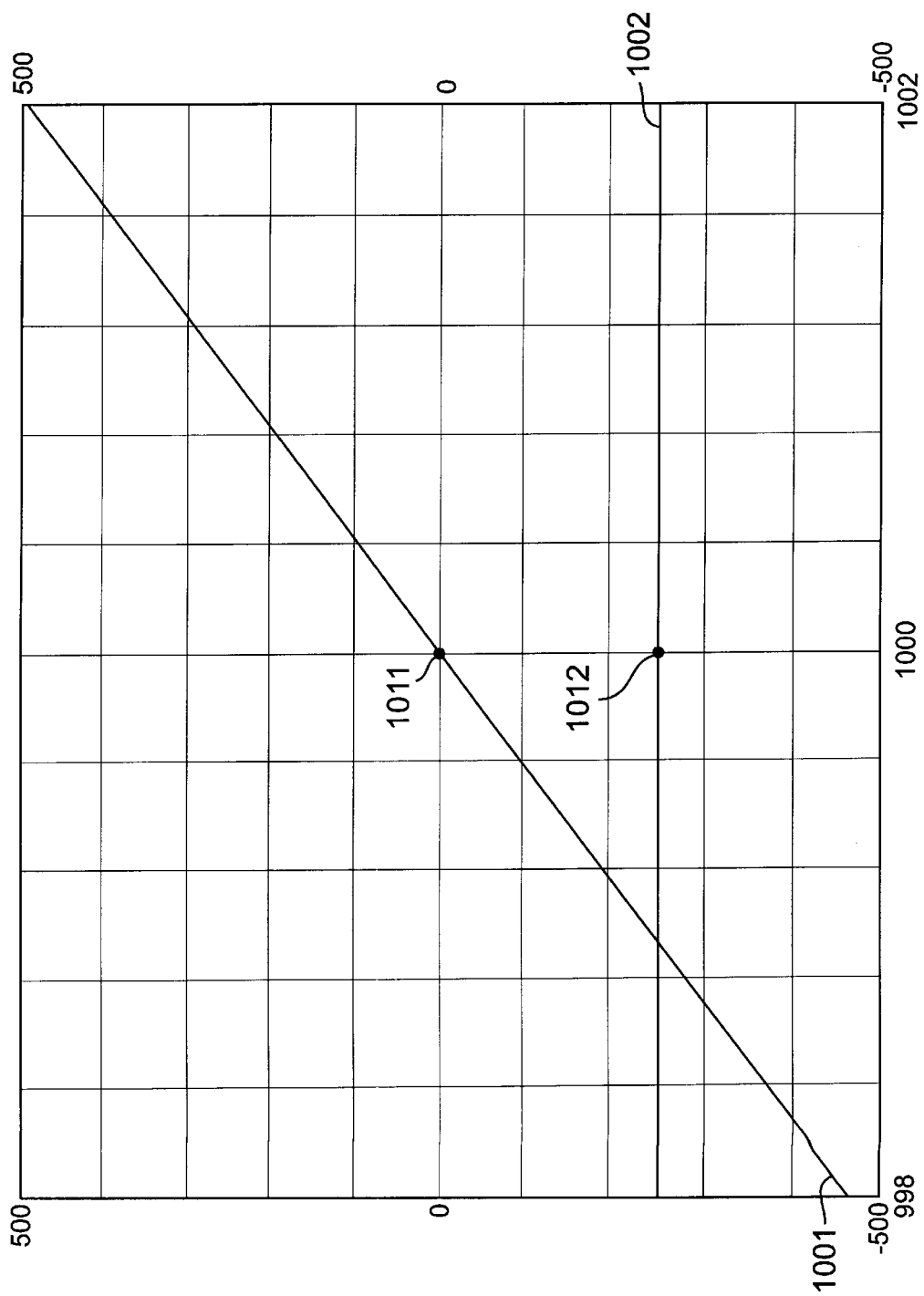
FIG. 10 is a frequency domain plot of the resistance curve and the reactance curve seen at the sense point in the circuit illustrated in FIG. 9, when an inductor has been added in the emitter of the oscillation transistor and an RF bypass capacitor has been added to the circuit.

FIG. 10 is a frequency domain plot of resistance curve 1002 and reactance curve 1001 seen at the sense point in the circuit illustrated in FIG. 9, when inductor 212 has been added in the emitter of oscillation transistor 204 and RF bypass capacitor 210 has been added to the circuit. Tuning capacitor C(tune) is tuned to 1.25278 pF to set the oscillation frequency to 1 GHz. Because of the addition of inductor 212, resistance curve 1002 is shifted upward with respect to resistance curve 602 in FIGS. 6–8. Additionally, reactance curve 1001 remains both linear and steep over the same range. At the nominal operating frequency of 1 GHz, the reactance is zero ohms (point 1011) and the resistance is about −250 ohms (point 1012).

Figure 11:
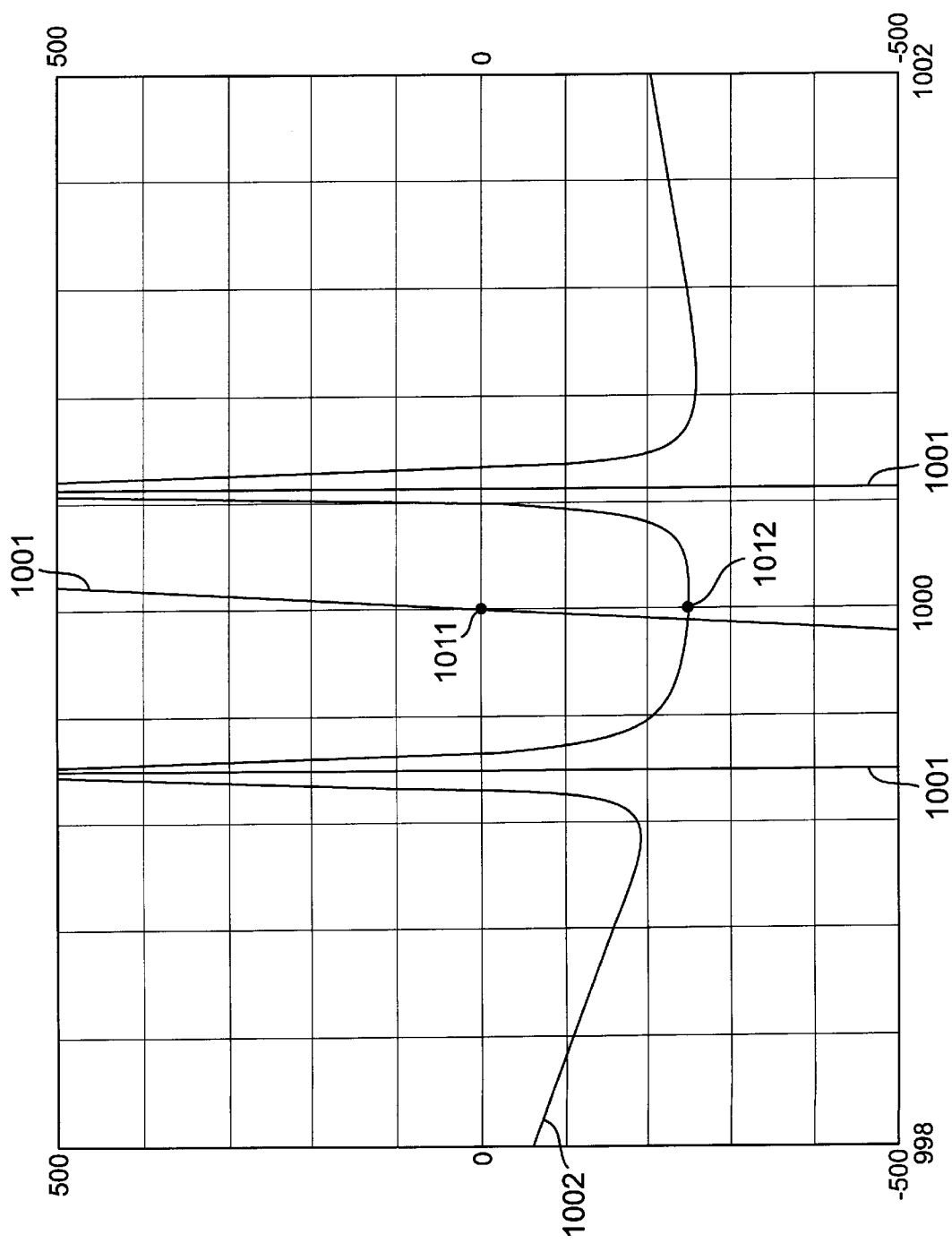
FIG. 11 is a wider frequency domain plot, from 950–1050 MHz, of the resistance curve and the reactance curve illustrated in FIG. 10.

FIG. 11 is a wider frequency domain plot, from 950–1050 MHz, of resistance curve 1002 and reactance curve 1001 illustrated in FIG. 10. Point 1012 on resistance curve 1002 and point 1011 on reactance curve 1001 are shown for reference purposes. Resistance curve 1102 again contains two positive resistance spikes, each more than 10 MHz away from the 1 GHz operating frequency and each displaced in the positive direction with respect to the resistance spikes in FIG. 7.

Figure 12:
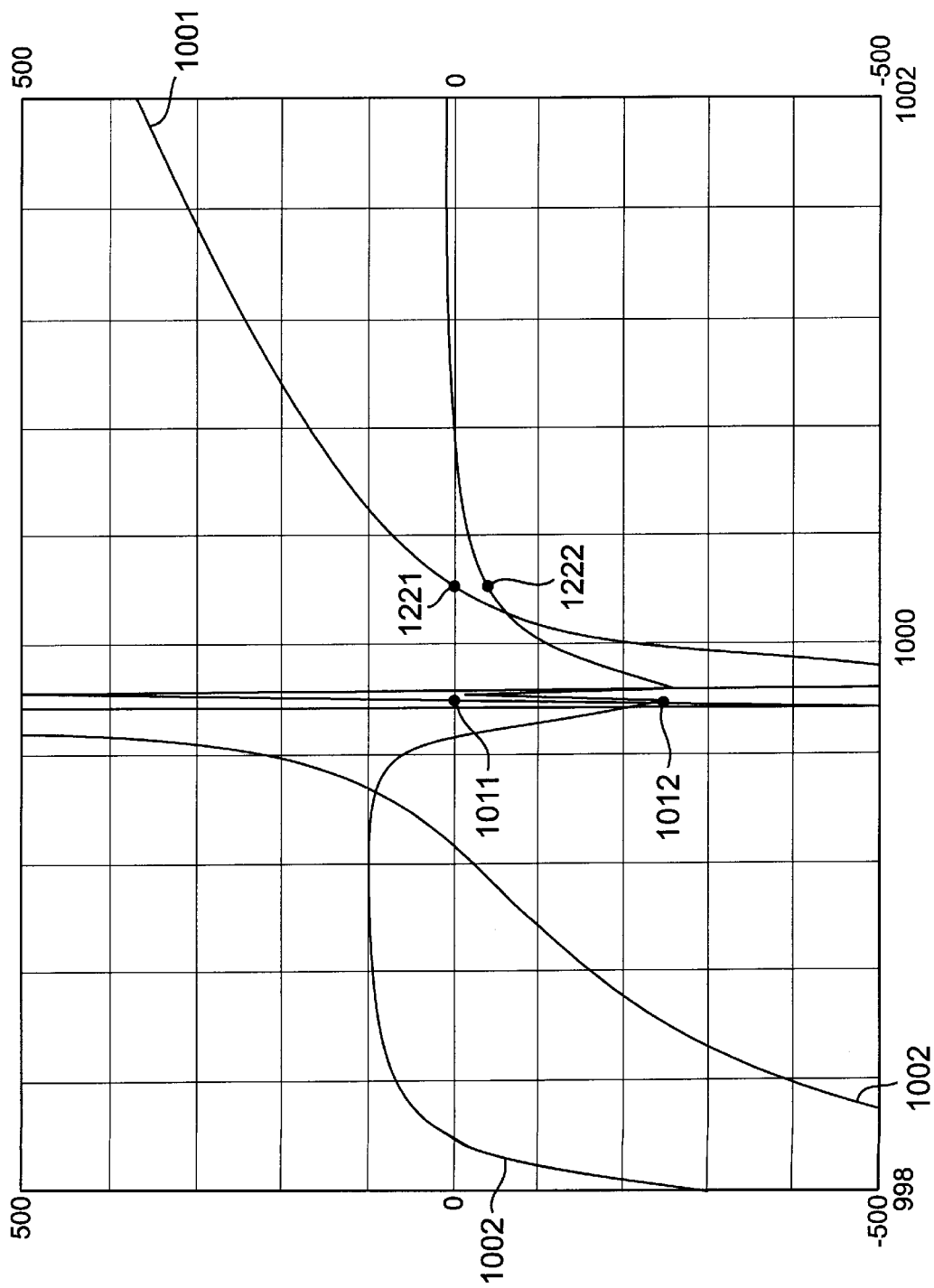
FIG. 12 is a very wide frequency domain plot of the resistance curve and the reactance curve illustrated in FIGS. 10 and 11.

FIG. 12 is a very wide frequency domain plot of resistance curve 1002 and reactance curve 1001 illustrated in FIGS. 10 and 11. Point 1012 on resistance curve 1002 and point 1011 on reactance curve 1001 are shown for reference purposes. Oscillation still occurs at the nominal operating frequency of 1 GHz (points 1011 and 1012). However, the potential lower oscillation frequency at about 720 MHz has been eliminated because, even though the reactance is zero ohms, the resistance is positive (i.e., about +100 ohms). Furthermore, at a frequency of about 1220 MHz, where the reactance is zero ohms (point 1221) and the resistance is about −35 ohms (point 1222), the probability of oscillation has been greatly reduced because the resistance is only slightly negative, and the frequency of oscillation is dominated by the much greater negative resistance at 1 GHz. Therefore, the oscillation occurs at 1 GHz dominates.

Figure 13:
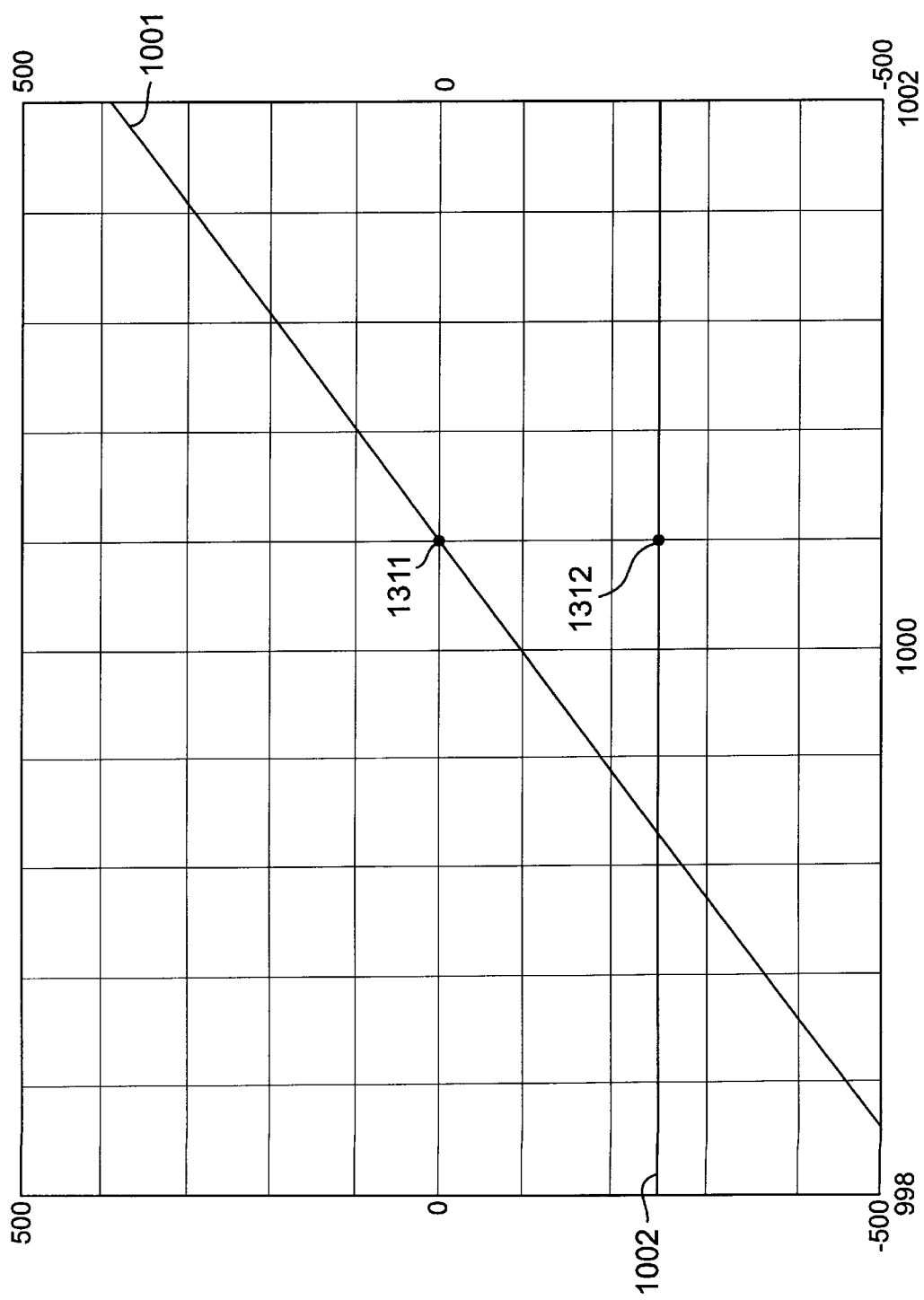
FIG. 13 is a frequency domain plot of the resistance curve and the reactance curve in FIGS. 10–12, demonstrating the effect of adjusting the tuning capacitor to a smaller value.
Figure 14:
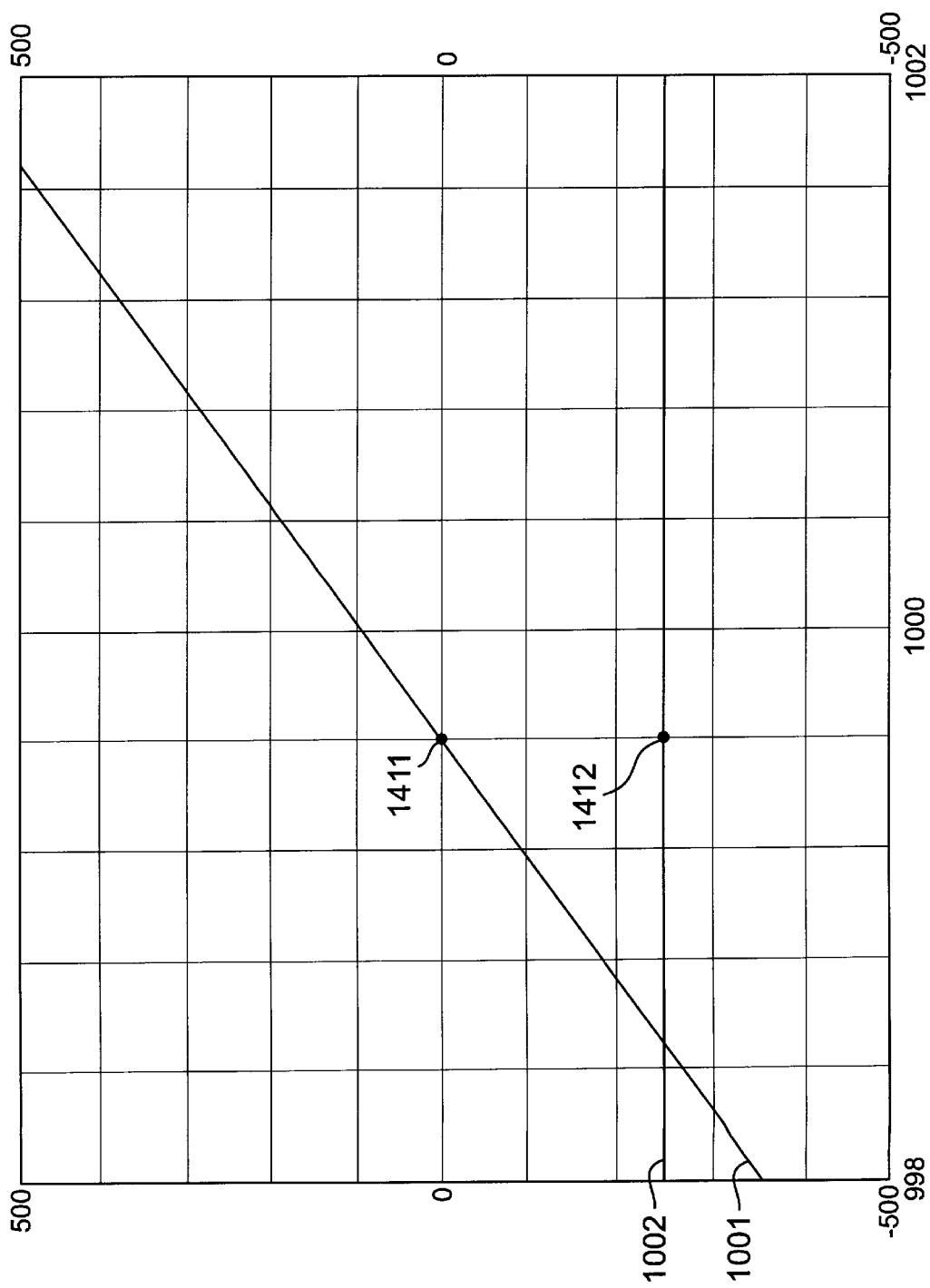
FIG. 14 is a frequency domain plot of the resistance curve and the reactance curve in FIGS. 10–12, demonstrating the effect of adjusting the tuning capacitor to a larger value.
Figure 15:
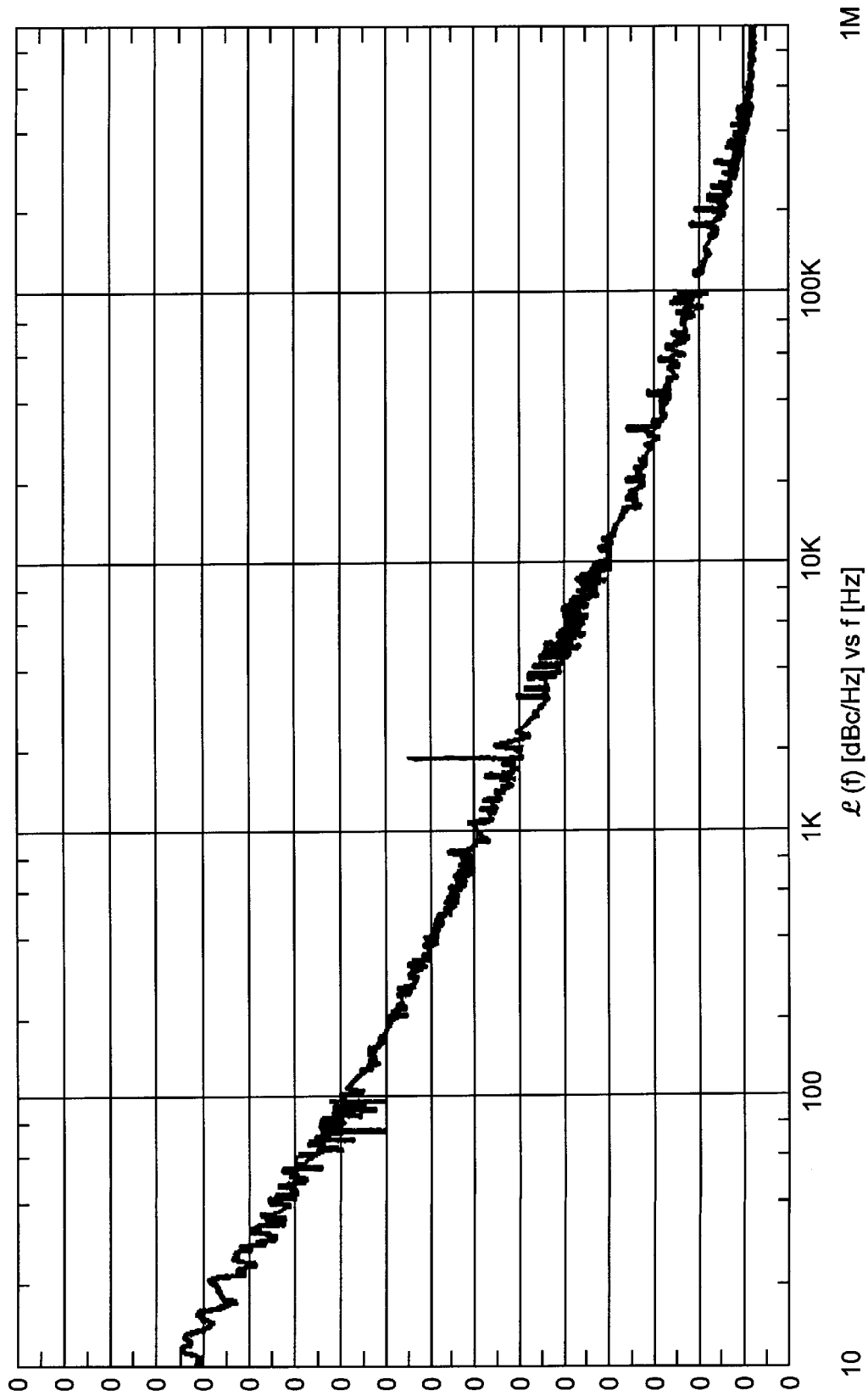
FIG. 15 is a frequency plot of the phase noise of the circuit illustrated in FIG. 2.

FIG. 13 is a frequency domain plot of resistance curve 1002 and reactance curve 1001, demonstrating the effect of electronically adjusting tuning capacitor C(tune) to a smaller value of 0.732475 pF. Increasing the capacitance increases the nominal operating frequency to about 1000.4 MHz, where the reactance is zero ohms (point 1311) and the resistance is about −250 ohms (point 1312). FIG. 14 is a frequency domain plot of resistance curve 1002 and reactance curve 1001, demonstrating the effect of electronically adjusting the tuning capacitor C(tune) to a larger value of 4.04034 pF. Increasing the capacitance decreases the nominal operating frequency to about 999.6 MHz, where the reactance is zero ohms (point 1411) and the resistance is approximately −250 ohms (point 1412). As FIGS. 13 and 14 demonstrate, this provides a tuning range of +/−400 PPM. The resultant phase noise performance is shown in FIG. 15.

Figure 16:
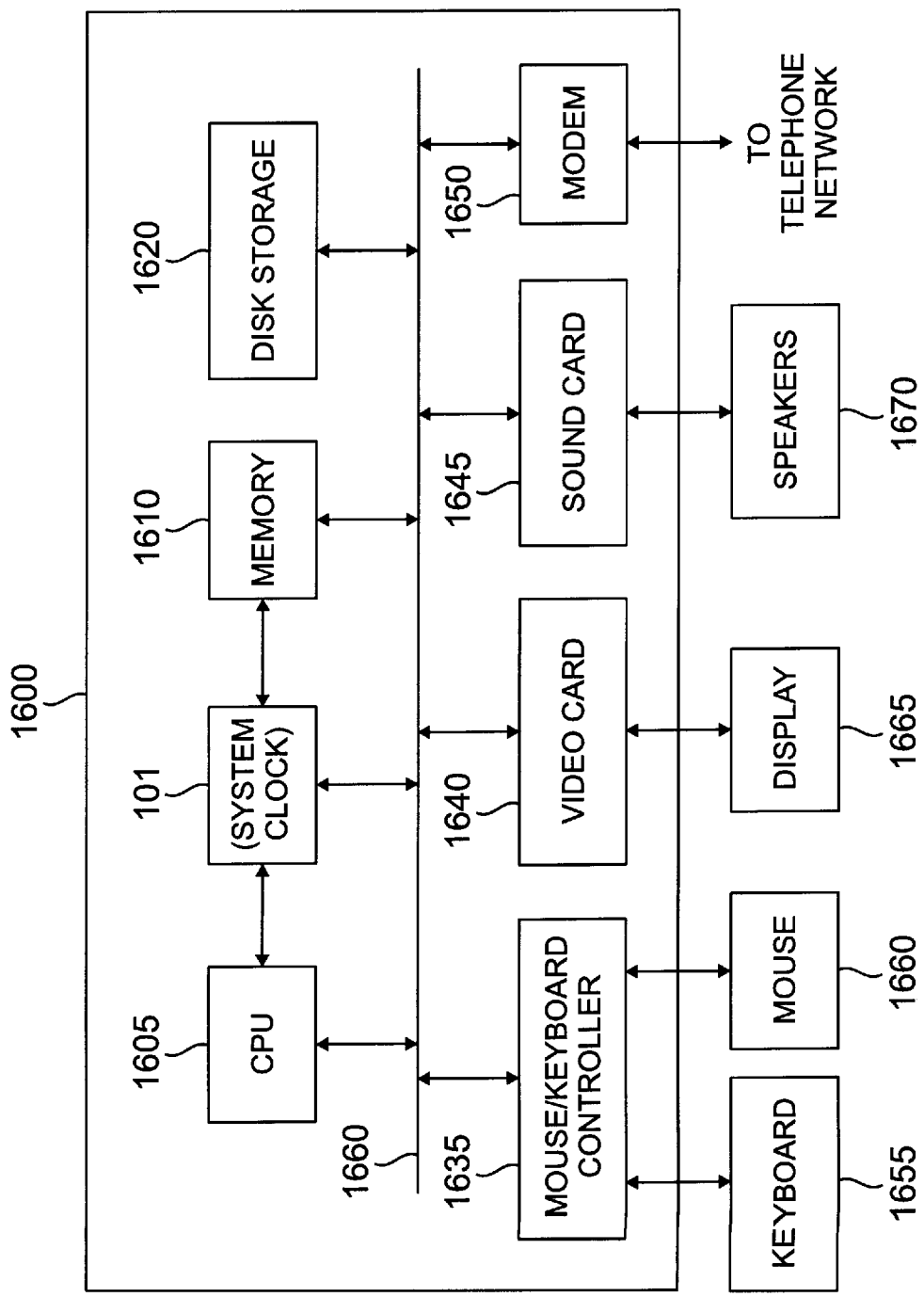
FIG. 16 illustrates an exemplary personal computer (PC) 1600 in which tunable high-frequency signal generator 101 is implemented as a system clock.
Figure 17:
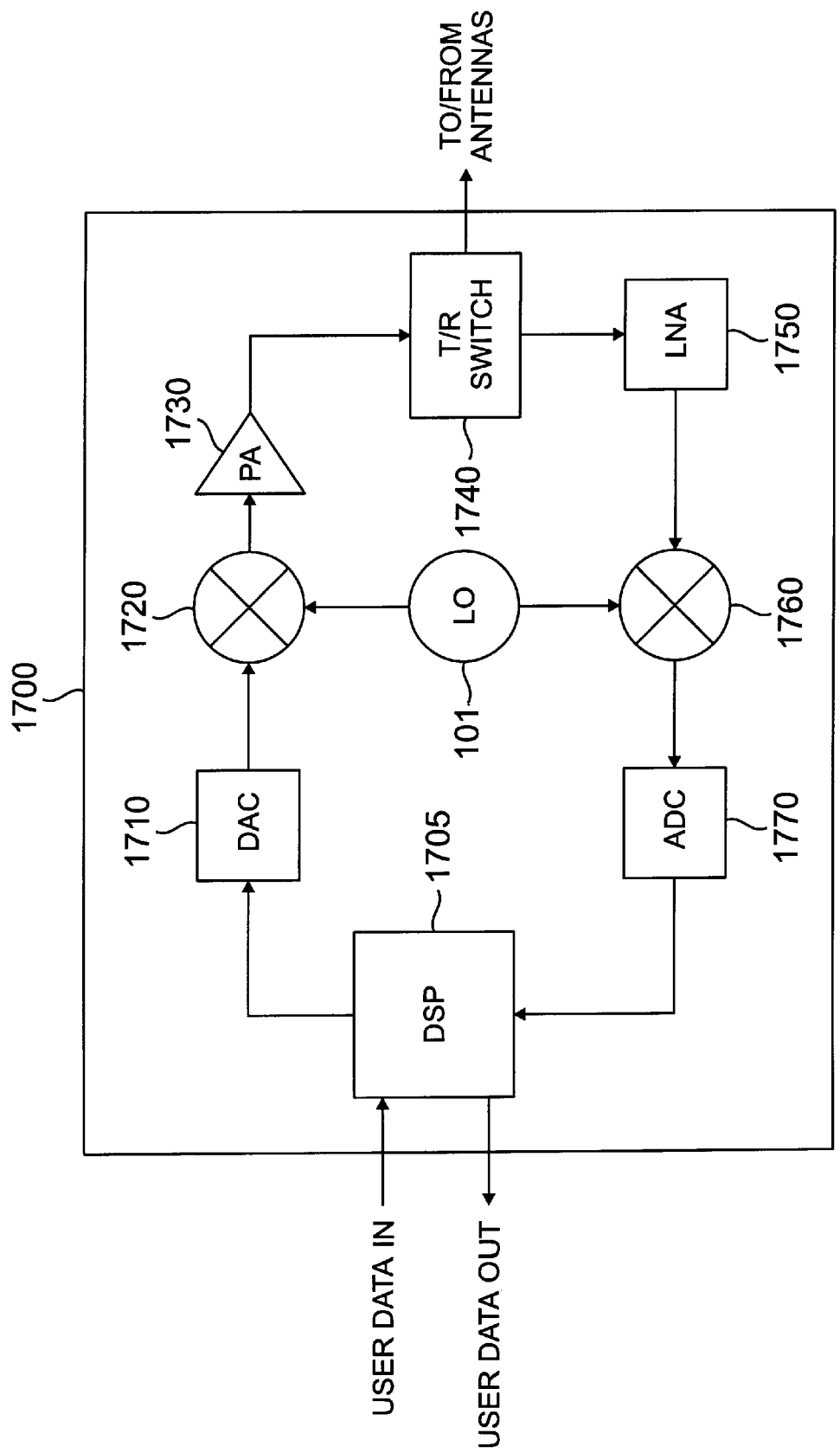
FIG. 17 illustrates an exemplary RF transceiver unit in which the tunable high frequency signal generator is implemented as a local oscillator (LO)

As mentioned above, exemplary electronic system 100 may be any one of a variety of devices, including a transceiver in a base station of a wireless network, a data processor, a testing or measuring device, a television tuner, a radio tuner, or the like. Specific exemplary embodiments are further described below in FIGS. 16 and 17. In FIG. 16, tunable high-frequency signal generator 101, which contains low phase noise VCSO 125 is implemented in a personal computer. In FIG. 17, tunable high-frequency signal generator 101 is implemented in a RF transceiver unit, such as may be found in a wireless network base station.

FIG. 16 illustrates an exemplary personal computer (PC) 1600 in which tunable high-frequency signal generator 101 is implemented as a system clock. PC 1600 further comprises central processing unit (CPU) 1605, main memory 1610, and disk storage device 1620. Disk storage device 1620 is representative of one or more readable and/or writeable fixed storage devices, such as a PC hard drive, and/or removable storage devices capable of receiving removable storage media, which may comprise, for example, a floppy disk, a ZIP disk, a CD-ROM disk, a DVD disk, or the like.

PC 1600 also comprises mouse/keyboard controller 1635, video card 1640, sound card 1645, and modem 1650. The various components of PC 1600 transfer data and control signals across bus 1660. The user inputs data and commands to PC 1600 via mouse/keyboard controller 1635, which provides-an interface between keyboard 1655 and mouse 1660 and CPU 1605. Modem 1650 provides a communication interface between PC 1600 and the publicly switched telephone network. The GUI operating system of PC 1600 transfers images to display device 1665 via video card 1640. Audio files are transferred to speakers 1670 via sound card 1645.

In a system clock implementation, tunable high-frequency signal generator 101 provides one or more clock signals to the other components in PC 1600. Tunable high-frequency signal generator 101 may also include frequency divider circuitry that generates multiple clock signals at different frequencies from the same fundamental low phase noise, high-frequency signal produced by tunable high-frequency signal generator 101. The different clock signals may then be used by CPU 1605, memory 1610, or other components in PC 1600 via bus 1660.

FIG. 17 illustrates an exemplary RF transceiver unit 1600 in which tunable high-frequency signal generator 101 is implemented as a local oscillator (LO). RF transceiver unit 1600 comprises digital signal processor (DSP) 1705, which sends and receives streams of user data to and from external user devices. DSP 1705 transfers RF signals to and from transmit/receive (T/R) switch 1740 via a transmit path and a receive path. The transmit path comprises digital-to-analog converter (DAC) 1710, RF modulator 1720, RF power amplifier 1730 and transmit/receive (T/R) switch 1740. The receive path comprises T/R switch 1740, low-noise amplifier (LNA) 1750, RF demodulator 1760, and analog-to-digital converter (ADC) 1770.

In transmit mode, DSP 1705 receives and processes incoming user data. The incoming user data is converted from a digital data stream to an analog baseband signal by DAC 1710. The analog baseband signal is one input signal of RF modulator 1720. The other input of RF modulator 1720 is an RF carrier signal generated by a local oscillator (LO) containing tunable high-frequency signal generator 101. The output of RF modulator 1720 is a modulated RF signal that is amplified by RF power amplifier 1730 and sent through T/R switch 1740 to an external antenna array.

In receive mode, incoming RF signals are received from the external antenna array by T/R switch 1740 and are sent to low-noise amplifier (LNA) 1750. LNA 1750 filters and amplifies the desired RF frequency. The amplified RF signal is one input signal of RF demodulator 1760. The other input of RF demodulator 1760 is an RF reference signal generated by the local oscillator (LO) containing tunable high-frequency signal generator 101. The output of RF demodulator 1760 is an analog baseband signal that is converted to a stream of digital data by ADC 1770. DSP 1705 the processes the digital data stream and sends the processed data to one or more external user devices.

Although the present invention has been described in detail, those skilled in the art should understand that they can make various changes, substitutions and alterations herein without departing from the spirit and scope of the invention in its broadest form.

What is claimed is:

1. An oscillator circuit having an input port and an output port and capable of receiving a frequency tuning signal on said input port and generating a tunable high-frequency output signal on said output port, said oscillator circuit comprising:

a tuning element coupled to said input port and having a variable capacitance responsive to said frequency tuning signal;

a first inductor having a first terminal coupled to said tuning element and a second terminal;

a SAW resonator having a first terminal coupled to said second terminal of said first inductor and a second terminal;

a second inductor having a first terminal coupled to said first terminal of said SAW resonator and a second terminal coupled to said second terminal of said SAW resonator; and a negative resistance generating circuit coupled to said second terminal of said SAW resonator, wherein, at a first oscillation frequency of said oscillator circuit, a reactance looking into said input port is approximately zero and a resistance looking into said input port is negative, wherein said negative resistance generating circuit comprises a transistor having a base coupled to said second terminal of said SAW resonator a third inductor having a first terminal coupled to an emitter of said transistor and a second terminal coupled to ground, and a first capacitor and a second capacitor coupled in series between said base of said terminal and ground.

2. The oscillator circuit set forth in claim 1 wherein said tuning element comprises at least one varactor diode.

3. The oscillator circuit set forth in claim 1 wherein a frequency domain curve of said reactance has a steep slope at said operating frequency.

4. The oscillator circuit set forth in claim 3 wherein modifying said variable capacitance causes said reactance looking into said input port to equal approximately zero at a second oscillation frequency.

5. The oscillator circuit set forth in claim 3 wherein said slope of said reactance at said operating frequency is approximately linear.

6. The oscillator circuit set forth in claim 1 wherein an operating frequency of said oscillator circuit may be varied across an operating range having an upper frequency limit and a lower frequency limit and wherein a frequency domain curve of said reactance has a steep slope across said operating range.

7. The oscillator circuit set forth in claim 1 wherein said frequency domain curve of said reactance is approximately linear across said operating range.

8. The oscillator circuit set forth in claim 1 wherein said SAW resonator has a resonance frequency and said first inductor causes said first oscillation frequency of said oscillator circuit to match said resonance frequency.

9. An electronic system comprising:
   at least one subsystem requiring a high-frequency reference signal; and
   a phase locked signal generator capable of generating a tunable high-frequency output signal comprising:
      a reference signal source generator capable of generating a first reference frequency signal;
      a comparator for comparing a phase of said first reference frequency signal and a phase of a frequency divided copy of said tunable high-frequency output signal and generating therefrom a frequency tuning signal;
      an oscillator circuit capable of receiving said frequency tuning signal on an input port and generating said tunable high frequency output signal an output port, said oscillator circuit comprising:
         a tuning element coupled to said input port and having a variable capacitance responsive to said frequency tuning signal;
         a first inductor having a first terminal coupled to said tuning element and a second terminal;
         a SAW resonator having a first terminal coupled to said second terminal of said first inductor and a second terminal;
         a second inductor having a first terminal coupled to said first terminal of said SAW resonator and a second terminal coupled to said second terminal of said SAW resonator; and
         a negative resistance generating circuit coupled to said second terminal of said SAW resonator, wherein, at a first oscillation frequency of said oscillator circuit, a reactance looking into said input port is approximately zero and a resistance looking into said input port is negative, wherein said negative resistance generating circuit comprises a transistor having a base coupled to said second terminal of said SAW resonator, a third inductor having a first terminal coupled to an emitter of said transistor and a second terminal coupled to ground, and a first capacitor and a second capacitor coupled in series between said base of said terminal and ground.

10. The electronic system set forth in claim 9 wherein said tuning element comprises at least one varactor diode.

11. The electronic system set forth in claim 9 wherein a frequency domain curve of said reactance has a steep slope at said operating frequency.

12. The electronic system set forth in claim 11 wherein modifying said variable capacitance causes said reactance looking into said input port to equal approximately zero at a second oscillation frequency.

13. The electronic system set forth in claim 11 wherein said slope of said reactance is approximately linear at said operating frequency.

14. The electronic system set forth in claim 9 wherein an operating frequency of said oscillator circuit may be varied across an operating range having an upper frequency limit and a lower frequency limit and wherein a frequency domain curve of said reactance has a steep slope across said operating range.

15. The electronic system set forth in claim 9 wherein said frequency domain curve of said reactance is approximately linear across said operating range.

16. The electronic system set forth in claim 9 wherein said SAW resonator has a resonance frequency and said first inductor causes said first oscillation frequency of said oscillator circuit to match said resonance frequency.

17. The electronic system set forth in claim 9 wherein said electronic system comprises a computer system and said tunable high-frequency output signal is a clock signal used by a data processor in said computer system.

18. The electronic system set forth in claim 9 wherein said electronic system comprises an RF transceiver and said tunable high-frequency output signal is an RF reference signal used in modulation and demodulation of signals.

19. A method of controlling a tunable high-frequency signal having low phase noise, the method comprising the steps of:
   generating a first reference frequency signal;
   in an oscillator circuit having an input port capable of receiving a frequency tuning signal and output port, generating the tunable high-frequency signal, wherein the oscillator circuit comprises:
      a tuning element coupled to the input port and having a variable capacitance responsive to the frequency tuning signal;
      a first inductor having a first terminal coupled to the tuning element and a second terminal;
      a SAW resonator having a first terminal coupled to the second terminal of the first inductor and a second terminal;
      a second inductor having a first terminal coupled to the first terminal of the SAW resonator and a second terminal coupled to the second terminal of the SAW resonator; and
      a negative resistance generating circuit coupled to the second terminal of the SAW resonator, wherein, at a first oscillation frequency of the oscillator circuit, a reactance looking into the input port is approximately zero and a resistance looking into the input port is negative, wherein said negative resistance generating circuit comprises a transistor having a base coupled to said second terminal of said SAW resonator, a third inductor having a first terminal coupled to an emitter of said transistor and a second terminal coupled to ground, and a first capacitor and a second capacitor coupled in series between said base of said terminal and ground;
   dividing the frequency ofthe tunable high-frequency signal to thereby produce a second reference frequency signal;
   comparing a phase of the first reference frequency signal and a phase of the second reference frequency signal and generating therefrom the frequency tuning signal.

20. The method set forth in claim 19 wherein the tuning element comprises at least one varactor diode.

* * * * *